United States Patent
Maaskant et al.

(10) Patent No.: US 9,515,238 B2
(45) Date of Patent: Dec. 6, 2016

(54) MICRO-LED ARRAY WITH FILTERS (71) Applicant: Oculus VR, LLC, Menlo Park, CA (US)

(72) Inventors: Pleun Maaskant, Douglas (IE); Brian Corbett, Douglas (IE); Bill Henry, Dublin (IE)

(73) Assignee: Oculus VR, LLC, Menlo Park, CA (US)

(*) Notice: Subject to any disclaimer, the term of this patent is extended or adjusted under 35 U.S.C. 154(b) by 0 days.

(21) Appl. No.: 14/378,834

(22) PCT Filed: Feb. 18, 2013

(86) PCT No.: PCT/EP2013/053215
§ 371 (c)(1),
(2) Date: Aug. 14, 2014

(87) PCT Pub. No.: WO2013/121051
PCT Pub. Date: Aug. 22, 2013

(65) Prior Publication Data
US 2015/0179904 A1 Jun. 25, 2015

Related U.S. Application Data (60) Provisional application No. 61/599,731, filed on Feb. 16, 2012.

(51) Int. Cl.
*H01L 33/00* (2010.01)
*H01L 33/58* (2010.01)
(Continued)

(52) U.S. Cl.
CPC ............... *H01L 33/58* (2013.01); *H01L 33/20* (2013.01); *H01L 33/44* (2013.01); *H01L 33/46* (2013.01);
(Continued)

(58) Field of Classification Search
CPC ....... H01L 33/20; H01L 33/44; H01L 33/58; H01L 33/64; H01L 33/46; H01L 2924/12041; H01L 33/08; H01L 2933/0058; H01L 2933/0025; H01L 33/507
See application file for complete search history.

(56) References Cited

U.S. PATENT DOCUMENTS

| 7,518,149 | B2 | 4/2009 | Maaskant et al. |
| 2006/0091411 | A1* | 5/2006 | Ouderkirk ............... H01L 33/58 257/98 |

(Continued)

FOREIGN PATENT DOCUMENTS

| JP | 2005252086 | 9/2005 |
| WO | WO 2007/005013 | 1/2007 |
| WO | WO 2011/007276 | 1/2011 |

OTHER PUBLICATIONS

InfiniLED: "μLED—Integrated Filter Light Source," Oct. 17, 2011, Version 3.

(Continued)

*Primary Examiner* — Thanh Y Tran
(74) *Attorney, Agent, or Firm* — Fenwick & West LLP (57) ABSTRACT

An integrated LED device is provided. The LED device includes a substrate. The LED device includes a semiconductor material including a light generating layer and positioned on the substrate. The semiconductor material and/or the substrate are configured to control light internally to output quasi-collimated light from a light emitting surface of the LED device. The LED device includes an optical component positioned at the light emitting surface and configured to receive quasi-collimated light exiting the light emitting surface and to alter one or more optical properties of at least some beams of the quasi-collimated light.

16 Claims, 4 Drawing Sheets (51) Int. Cl.
  *H01L 33/20* (2010.01)
  *H01L 33/44* (2010.01)
  *H01L 33/46* (2010.01)
  *H01L 33/64* (2010.01)
  *H01L 33/08* (2010.01)

(52) U.S. Cl.
  CPC .............. *H01L 33/64* (2013.01); *H01L 33/08* (2013.01); *H01L 2933/0025* (2013.01); *H01L 2933/0058* (2013.01)

(56) References Cited

U.S. PATENT DOCUMENTS

| | | | | |
|---|---|---|---|---|
| 2008/0128730 A1* | 6/2008 | Fellows | .................. | H01L 33/22 257/98 |
| 2011/0025191 A1* | 2/2011 | Xu | ........................ | H01L 33/505 313/501 |
| 2011/0205049 A1 | 8/2011 | Kmetec et al. | | |
| 2013/0070449 A1* | 3/2013 | Hu | ........................ | F21V 7/0041 362/231 |
| 2013/0170220 A1* | 7/2013 | Bueeler | .................... | F21K 9/00 362/296.01 |

OTHER PUBLICATIONS

InfiniLED: "μLED—Integrated Filter Light Source," Oct. 17, 2011, Version 2.
http://www.infiniled.com/downloads/datasheets/previous-versions; InfiniLED: Data Sheets—previous versions, Oct. 17, 2011.
Tanriseven, Selim, et al., *Broadband Quantum Dot Micro-Light-Emitting Diodes With Parabolic Sidewalls*, Applied Physics Letters, American Institute of Physics, vol. 92, No. 12, Mar. 24, 2008, pp. 123501-1-123501-3.
Tanriseven, Selim, et al., *Low Effective Surface Recombination in IN(Ga)As/GaAs Quantum Dot Diodes*, Journal of Applied Physics, American Institute of Physics, vol. 110, No. 3, Aug. 2, 2011, pp. 034508-1-034508-5.
Search Report for related International Patent Application No. PCT/EP2013/053215, mailed May 28, 2013.

* cited by examiner

MICRO-LED ARRAY WITH FILTERS

CROSS-REFERENCE TO RELATED APPLICATIONS

This application is a National Phase Application filed under 35 USC 371 of International Application No. PCT/EP2013/053215, filed on Feb. 18, 2013, which claims the benefit and priority from U.S. Provisional Patent Application No. 61/599,731, filed Feb. 16, 2012, the disclosures of which are incorporated herein by reference in their entirety.

TECHNICAL FIELD

The present disclosure relates to LED devices, arrays of LED devices and methods of manufacturing LED devices. Specifically, the present disclosure relates to, but is not limited to, LED devices including an optical component located on a light emitting surface of the LED device. More specifically, the present disclosure relates to, but is not limited to, μLED devices providing a quasi-collimated light output.

BACKGROUND OF THE INVENTION

LEDs convert electrical energy into optical energy. In semiconductor LEDs, light is usually generated through recombination of electrons, originating from an n-type doped semiconductor layer, and holes originating from a p-type doped semiconductor layer. In some infra-red emitting semiconductor materials light can be generated by electron intersub-band transitions rather than electron hole transitions. Herein, the area where the main light generation takes place is termed the light-emitting layer.

Further, as used herein, the term "light" is used in the sense that it is used in optical systems to mean not just visible light, but also electromagnetic radiation having a wavelength outside that of the visible range.

A major challenge is to extract as much of the emitted light as possible from the semiconductor material into the surrounding medium, typically air. This is hindered by total internal reflection at the surfaces of the semiconductor.

In traditional cuboid shaped LED devices, the average path length for light rays within the semiconductor is long, and the average number of reflections of an emitted light ray at semiconductor surfaces is high, prior to escape from the device. Long path lengths and reflections at metal coated semiconductor surfaces both lead to absorption losses. The light that does escape, escapes to a large extent through the sides of the chip and an external mirror may be used to collect this light into a useful light beam. Another approach is called chip shaping. Higher extraction efficiencies (EE) are possible with this approach. However, it does not eliminate the long path lengths within the semiconductor chip, nor the requirement for an external mirror. Also, the technique is less suitable to the widely used gallium nitride (GaN) based materials systems. The reason for this is that the sapphire and silicon carbide (SiC) substrates commonly used in GaN-based LED-chips are both very hard materials and very difficult to shape mechanically, for example with a dicing saw. In LED devices using such materials, it seems not to be a practical solution to shape the whole chip.

As used herein, the term "extraction efficiency" encompasses the amount of useful light extracted from an LED device as a proportion of the total light generated by the device. The EE may be expressed as a percentage.

Another common approach to improve the EE of LEDs is to roughen the surfaces where the light exits the chip. This reduces the amount of light trapped by total internal reflection that occurs by randomising the angles at which the light hits the surface.

LEDs have a wide range of applications. They are used in displays, medical devices, diagnostic devices, vision equipment, projectors and consumer goods amongst other things. In a large number of these applications the light generated by the LED must be further manipulated after it exits the chip. For example in a projector the light generated should be focused on a screen which is to be viewed. This typically requires the positioning of lenses, reflectors and/or other components between the source and the screen. In another example, when used in a fluorescence based analysis system the light generated should be focussed on to the sample of interest, and may require optical filtering and mitigation of the amount of stray light.

Therefore, additional components are typically required for the correct operation of an LED device, but they add bulk and complexity to the device itself and the optical path of the light within the device before it escapes from the light emitting surface. These issues become of greater importance when the total system or the object of interest is small.

U.S. Pat. No. 7,518,149 describes an LED device with improved the EE and producing light which exits the LED chip within a defined set of angles. The device described in U.S. Pat. No. 7,518,149 is referred to as a μLED and is created as an integrated diode structure in a mesa, in which the mesa shape and the light-emitting region are chosen for optimum EE.

SUMMARY OF THE INVENTION

According to the present disclosure in a first aspect, there is provided an integrated LED device. The LED device includes a substrate. The LED device includes a semiconductor material including a light generating layer and positioned on the substrate. The semiconductor material and/or the substrate are configured to control light internally to output quasi-collimated light from a light emitting surface of the LED device. The LED device includes an optical component positioned at the light emitting surface and configured to receive quasi-collimated light exiting the light emitting surface and to alter one or more optical properties of at least some of the quasi-collimated light.

As the LED device is configured to output quasi-collimated light, the light emitted from the light emitting surface is incident on the optical component at an angle to improve the efficacy of the optical component. It is therefore possible to position the optical component directly at the light emitting surface. Such an arrangement produces an integrated LED device that requires no external optical components.

In another aspect, at least part of the semiconductor material forms a mesa configured to output quasi-collimated light from a light emitting surface of the LED device.

In another aspect, the optical component includes a coating deposited on the light emitting surface of the LED device.

In another aspect, the coating includes one or more oxide layers.

In another aspect, the coating includes alternating oxide layers having different refractive indices.

In another aspect, the optical component includes an optical filter.

In another aspect, the filter includes one or more of an absorption filter, a dichroic filter, a polarizing filter and a metallo-dielectric filter.

In another aspect, at least a portion of the optical component acts as a lens. Optionally, at least a portion of the optical component includes a lens. Optionally, the optical component may include a lens. The lens may be in the form of a coating that creates a Fresnel type lens. The lens may be formed by etching a shape into the substrate material which results a change in the beam profile of the light that emerges from the light emitting surface of the LED device. A coating may be deposited on light emitting surface such that it can be used to define the properties of a lens during a subsequent step. The lens may be of Fresnel type where a change in beam profile is caused by a structured coating. The lens may be created by shaping the light emitting surface. The lens may be configured to modify the beam profile of the light such that it is narrower or wider than that which would ordinarily emerge from the light emitting surface. The lens may be of Fresnel type such that a coating is used to produce a structure on the substrate which modifies the light. The lens may be a shaped structure such that the shaping of the substrate affected the profile of the light beam. A coating may be placed on the light emitting surface which will define the structure of the lens.

In another aspect, the optical component includes a blocking element configured to block light emitted by the LED device at angles above a predetermined threshold angle.

In another aspect, the blocking element includes a metal reflective layer configured to internally reflect light attempting to escape the LED device.

In another aspect, the optical component includes one or more of: an anti-scratch layer; a hydrophobic layer; an anti-reflective layer; and a thermally conductive layer.

In another aspect, the optical component includes one or more of: phosphors, nano-materials and quantum dots, configured to emit a wavelength of light different from the wavelength of light emitted by the LED device.

In another aspect, the optical component is patterned to produce a patterned light beam.

In another aspect, the optical component is configured to produce a light beam having a diffraction pattern.

In another aspect, the LED device is a μLED device.

According to the present disclosure in a second aspect, there is provided an LED chip including an array of LED devices as discussed above.

According to the present disclosure in a third aspect, there is provided a method of fabricating an integrated LED device. The method includes depositing a layer of semiconductor material on a substrate. The semiconductor material includes a light generating layer. The semiconductor material and/or the substrate are configured internally to control light generated by the light generating layer to output quasi-collimated light from a light emitting surface of the LED device. The method-includes positioning an optical component at the light emitting surface. In use, the optical component receives quasi-collimated light exiting the light emitting surface and alters one or more optical properties of at least some of the quasi-collimated light. In general, the light emitting surface may be treated through mechanical or chemical methods to be flat such that the light reaching the optical component is reflected to a wide set of angles.

In another aspect, the method further includes forming at least part of the semiconductor material into a mesa configured to output quasi-collimated light from a light emitting surface of the LED device.

In another aspect, the optical component is a coating deposited on the light emitting surface of the LED device.

BRIEF DESCRIPTION OF THE DRAWINGS

Exemplary implementations of the invention are disclosed herein with reference to the accompanying drawings, in which.

DETAILED DESCRIPTION

Generally, disclosed herein is an LED device having an optical component integrated into the device and configured to change an optical property of at least some of the light emitted from the device. In exemplary LED devices, the optical component is a coating applied to a light emitting surface of the device. Exemplary LED devices include a micro-LED (μLED) device with one or more optical coatings on a light emitting surface.

The surface where the light escapes from the LED may be referred to as the "light emitting surface", the "light exiting surface". Light is generated in a light generating layer, which may also be termed a light emitting layer, and the surface closest to this layer may be referred to as the light generating surface.

The inventors have appreciated that the performance of optical components is generally affected by the angle of incidence of light on the optical component. The inventors have further appreciated that an LED device may be configured to generate a quasi-collimated light beam that hits its light emitting surface with a tightened set of angles around the surface normal. As disclosed herein, the inventors have appreciated that an optical component may be integrated into an LED device configured to output quasi-collimated light, without the need for additional external components. For example, when one places optical coatings on a light emitting surface of a μLED, one not only achieves space and cost savings, but one can also obtain superior optical performance from the combination of the μLED and the optical coating, due to the tightened set of angles of light output from the μLED.

As used herein, the term "quasi-collimated light" encompasses light that has a reduced beam angle compared to light emitted from a standard unfocussed LED device. For example, a quasi-collimated light beam may have an angular beam width ($2\Theta_{½}$, defined as the sum of two angles on either side of the surface normal, at which the intensity of light emitted has dropped to 50% of the maximum intensity, e.g. at the normal) in a range from 0 degrees to 80 degrees, in a range from 0 degrees to 60 degrees, in a range from 5 degrees to 80 degrees, in a range from 5 degrees to 75 degrees, in a range from 5 degrees to 50 degrees or, for a specific light beam, a beam angle of substantially 40 degrees. In comparison, a standard unfocussed LED device may produce beam angles of 120 degrees or more. The beam width narrows and widens as the beam passes through materials with different refractive index values. The values quoted above are the beam widths in air As mentioned above, the inventors have appreciated that in general, for optical components to perform as predicted, it is desired that light reaches them within a controlled set of angles. The inventors have further appreciated that an optical component may be applied directly to the light emitting surface of an LED device producing quasi-collimated light and the optical component will perform as expected without the need for additional external optical components. Because light emitted from standard LED devices has such a wide beam angle, such devices include further external optical components such as mirrors, focussing components and filters to control the beam angle of the light before it may be received by an optical component.

As noted in the discussions above, there are a number of methods for increasing the extraction efficiency of an LED device. However, these methods typically result in light exiting from the light emitting surface of the chips with a large angular dispersion i.e. at a wide range of angles. Typically, light is emitted from the light emitting surface at a far broader beam angle that cannot effectively be received by an optical component. The performance of many optical components is dependent on the angle of incident of light. The angular dispersion of standard LED devices limits the amount of light that may be used within the system or forces the use of a large number of optical components. In summary, it is very problematic to extract light with high EE from an LED and also use the extracted light in an optimum manner, e.g. ensuring that light is incident on optical components at a suitable angle to the normal. In addition, any optical component applied directly at a standard LED device light emitting surface will have very limited effect on performance due to the range of angles at which the light is generated and is incident on the optical component.

Figure 1:
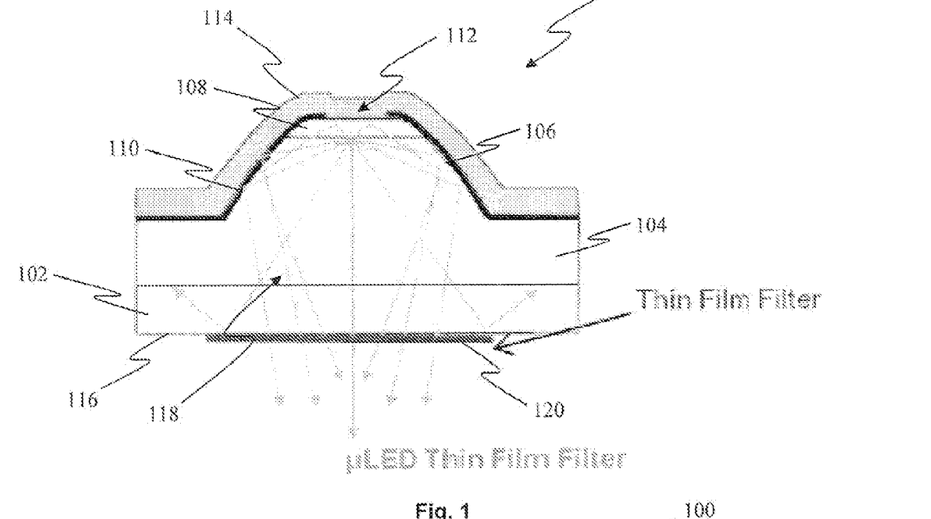
FIG. 1 is schematic representation of a section through an LED device.
Figure 2A:
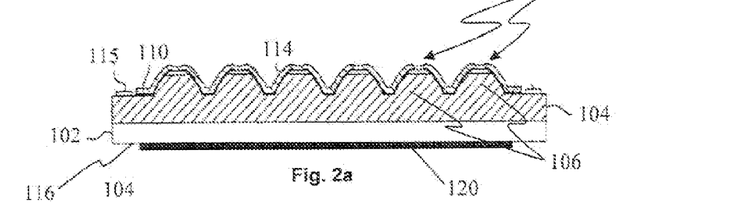
FIG. 2a is schematic representation of a section through an array of LED devices.

Referring to FIG. 1, an LED device 100 including an integrated optical component is shown. The LED device includes a substrate 102 and a semiconductor material 104 located on the substrate 102. In exemplary LED devices, the substrate 102 may include the same material as the semiconductor material 104. The semiconductor material 104 is shaped into a mesa 106. A light emitting layer 108 is located on top of the semiconductor material 106. The light emitting layer forms part of the mesa 106. An electrical insulating layer 110 is located on top of the semiconductor material 104 and part of the light emitting layer 108. The electrical insulating layer 110 includes an aperture 112, which leaves a portion of the light emitting layer 108 exposed to allow an electrical contact to be made with the light emitting layer. An electrical contact 114 is placed on the electrical insulating layer 110 such that a portion of the electrical contact 114 fills the aperture 112 in the electrical insulating layer 110 and makes contact with the light emitting layer 108. The remainder of the electrical contact is electrically isolated from the light emitting layer 108 and the semiconductor material 104 by the electrical insulating layer 110. An additional electrical contact 115 (see FIG. 2) is positioned in contact with the semiconductor material to complete the circuit and allow an electrical current to be applied to the LED device.

In exemplary LED devices 100, the substrate may substantially include one or more of sapphire, gallium nitride, aluminium nitride, gallium arsenide, indium phosphide, gallium phosphide and/or silicon carbide. In exemplary LED devices, the semiconductor material may include one or more of indium gallium nitride, aluminium gallium phosphide, gallium arsenide, gallium arsenide phosphide, zinc selinide or any combination of these materials such that a light emitting semiconductor is formed.

In the exemplary LED device 100 of FIG. 1, the LED device is a μLED device. The term μLED device as used herein encompasses the definition of such devices in, for example, U.S. Pat. No. 7,518,149. In exemplary LED devices, a μLED may have a diameter in a range from 15 μm to 25 μm, or in specific μLED devices, 20 μm. As shown in FIG. 1, the μLED 100 includes a substrate 102 and a semiconductor layer 104, a mesa 106, a light emitting layer 108, and an electrical contact 114, which makes contact with at least part of the light emitting layer 108. The μLED 100 has a very high EE because of the shape of the mesa 106, which is configured to direct a substantial proportion of the generated light from a light emitting surface 116. Light is generated within the light emitting layer 108 of the mesa 106, which is shaped to enhance the escape probability of the generated light from the light emitting surface 116. Very high EEs are achieved, particularly with a near parabolic mesa 106 that has a high aspect ratio, such as the mesa 106 shown in FIG. 1. The top of the parabolic mesa 106 is truncated above the light-emitting layer 108, providing a flat surface for the electronic contact 114 on the top of the semiconductor mesa 106. The efficiency of the LED device 100 is increased when the top electrical contact 114 has a high reflectivity value.

The structure of the μLED 100 provides output light that is quasi-collimated. This makes the μLED 100 a new type of semiconductor light source which can be positioned somewhere between a laser (where the light is coherent and highly directional) and a standard LED (where the light is scattered in all directions). The μLED device 100 allows for quasi-collimated beams to be produced with a focus (or beam angle, as defined above) of 40 degrees or less. A specific μLED device may emit light with a beam angle of 24 degrees or less. This is compared to standard unfocussed LEDs which produce beam angles in excess of 120°.

In operation, light is generated in the light emitting layer 108 and is emitted in all directions. Some light directly escapes from the light emitting surface 116 of the LED device 100. Other light is directed toward the walls and upper surface of the mesa 106 and is reflected back towards the light emitting surface 106, from where it escapes the device 100. This is shown in FIG. 1 by arrows 118. It can be seen from FIG. 1 that a significant proportion of the light emitted by the LED device 100 is between a relatively small range of angles. This is how the quasi-collimated light beam is provided.

An optical component 120 is located on the light emitting surface 116 of the LED device 100. A high proportion of the light escaping the device 100 is incident on the light emitting surface 116 at an angle within a predetermined range of a normal to the light emitting surface 116. Therefore the light escaping the device 100 is incident on the optical component 120 at an angle within the predetermined range of the normal. Therefore, a high proportion of the light incident on the optical component 120 is within a range of angles such that the optical component is effective on that light. The optical component 120 is configured to alter one or more optical properties of light emitted from the LED device 100, as explained in greater detail below.

The combination of an LED device (or a μLED device) 100 with an optical component 120 on the light emitting surface 116, is able to provide enhanced performance, as the LED device 100 illuminates the optical component 120 with a tightened set of incident light angles (enhanced directionality). In exemplary LED devices, the optical component includes a coating applied to the light emitting surface 116 of the device 100. Optical components 120 can be formed from these coatings and therefore the collimated light generated by the LED device 100 allows for optical components to be integrated with a LED device 100.

The coating process can be carried out during the LED fabrication process, which results in cost savings, as two separate components are replaced by a single integrated device. The robustness of the LED device 100 is enhanced as the LED and its integrated components cannot be detached or become misaligned. There are also benefits of space saving within the optical path as the optical component 120 is at the closest possible position to the light generating layer 108 of the device 100. Disclosed herein is an LED device including one or more optical components integrated at the surface of light extraction.

The LED devices disclosed herein integrate an optical component, formed as a coating, onto an LED (or µLED) device at the point where light emerges from the device. The coating is applied to manipulate or alter at least some of the light emitted from the LED device. For example, the optical component may be configured to act only on light within a predetermined wavelength range or a predetermined range of incidence angles.

In a preferred implementation, the coating is applied to a quasi-collimated µLED, for example, such as those described in U.S. Pat. No. 7,518,149. The coating may be deposited directly on the exit face (or light emitting surface) of the LED device and therefore is in the closest location possible to the site of light generation.

In a number of applications in which LED devices are used further optical processing is required for the light to be of use. Components such as filters, mirrors or dichroic elements may be used to enhance the light output for a given application and thereby improve the performance of the overall LED device in that application. For example, in diagnostic applications, the presence of an emission tail from the light emitted by an LED device can overlap with the emission from a target analyte. Currently, filters which are separate from the LED device are used to mitigate this problem. As explained above, these external optical components add cost, bulk and complexity to a system.

Disclosed herein are methods and apparatus providing a coating on the light emitting surface of an LED device, specifically a µLED device with a truncated parabolic shaped mesa (see FIG. 1), with materials that alter one or more optical properties of light escaping the LED device.

The optical component may be fabricated by the deposition of alternating layers of oxides onto a transparent surface. An optical component may include alternating layers of oxide with different refractive index values, so as to form interference filters (e.g. to produce constructive and destructive interference at specific wavelengths). In general the transparent surfaces (or substrates) may be glass or quartz. Such optical components may be used in systems in which they are positioned separate from the LED itself. However, in LED devices disclosed herein, the optical components are integrated into the LED device and may be in physical contact with the light emitting surface. To reduce cost and weight, some optical components may be manufactured from plastics materials.

In LED devices disclosed herein, the layers of oxides are deposited directly onto the light emitting surface of an LED device to alter an optical property of the light emitted from the LED device. Therefore, the optical component, such as a filter, is integrated with the light source (or LED), removing the need for additional components in the optical system and reducing the size, complexity and cost of the LED device.

In exemplary LED devices, the optical component may alter one or more optical properties of the emitted light such as: changing the wavelength spectrum of the emitted light by filtering out particular wavelengths; altering the polarisation of emitted light; blocking at least part of the emitted light; or converting the wavelength of emitted light. The conversion of light may be carried out by a phosphorescent or fluorescent layer, which absorbs light at a first wavelength and re-emits light at a second, different wavelength. The second wavelength may be lower than the first wavelength. The optical component may therefore include a phosphorescent or fluorescent layer.

The optical component may include a lens. The lens may be in the form of a coating that creates a Fresnel type lens. The lens may be formed by etching a shape into the substrate material which results a change in the beam profile of the light that emerges from the light emitting surface of the LED device. A coating may be deposited on light emitting surface such that it can be used to define the properties of a lens during a subsequent step. The lens may be configured to modify the beam profile of the light such that it is narrower or wider than that which would ordinarily emerge from the light emitting surface. The lens may be of Fresnel type such that a coating is used to produce a structure on the substrate which modifies the light. The lens may be a shaped structure such that the shaping of the substrate affected the profile of the light beam. A coating may be placed on the light emitting surface which will define the structure of the lens.

This system is especially applicable to the deposition of filter layers on to a quasi-collimated µLED device. In such arrangements, the light exiting the device is within a quasi-collimated beam angle and is therefore incident on and directed through the filter such that the filter is effective on the light. In exemplary µLED devices, the optical component only has to be deposited onto one surface of the µLED.

In an exemplary µLED device, the coating deposited on the µLED is a polarising filter and is deposited on to a quasi-collimated µLED having a mesa. As the filter acts as a polariser, only collimated light exiting the µLED is able to pass through the filter. The combination of a collimated µLED and filter coating removes the requirement to include collimating optics and discrete filters, thereby reducing space, weight and cost for many applications which require polarised light.

Examples of applications where light sources are used with additional optical components include microscopy, spectroscopy, vision systems, biomedical optics, detection, diagnostics and displays.

In an exemplary LED device, the coating may include a layer deposited on the light emitting surface of the LED device to block stray light. The light blocking layer may include metal. That is, the light blocking layer may be deposited around the optical component such that light at an incident angle greater than a predetermined threshold is blocked from exiting the LED device. In another implementation, the optical component may include a coating having an oxide or a mixture of oxides and may be used for filtering, polarisation or other purposes.

The optical component may include a coating applied as an anti-scratch layer, a hydrophobic layer or a thermally conductive layer.

In an exemplary LED device, the coating may incorporate phosphors for wavelength conversion. In another implementation, the coating may incorporate nano-materials or quantum dots which may be used for sensing or wavelength conversion. The coating may incorporate transparent electrodes such as ITO (indium tin oxide) electrodes. The phosphor coating can be used to generate a different wavelength of light from that emitted from the light generating layer of the LED device. This new wavelength may be one at which the semiconductor produces light with low efficiency. The phosphor may also be used to create an emission with a wider spectrum than the LED material of the light generating layer.

In an exemplary LED device, the coating may include electro-active or photo-active monomers or polymers which have properties that are affected by the presence of light. Applications for such organic semiconducting films include thin film photovoltaics and chemical sensors, amongst others. The ability to coat these photoactive materials directly to the LED light emitting surface without loss of performance can result in device of greatly reduced size. In an exemplary LED device, the coating is a photopolymer whose fluorescence may be reduced in the presence of certain gases and as such acts as gas detectors. As light only exits through one surface of the LED device, only a single surface has to be coated.

In order for an optical component to perform correctly the angles of incidence of the light which reach it must be within a certain range. Therefore, when using a standard LED light source, with its diffuse emission angles, a number of additional external optical elements are required to produce correct performance. At a minimum there is a requirement for a light source, a collimating device and the functioning optical component. The LED devices disclosed herein integrate all these elements into a single semiconductor chip. The quasi-collimated emission from the LED device provides superior performance than can be achieved by a standard LED. The integration of these elements into a single chip reduces cost, the complexity of the system and its overall bulk.

Figure 2B:
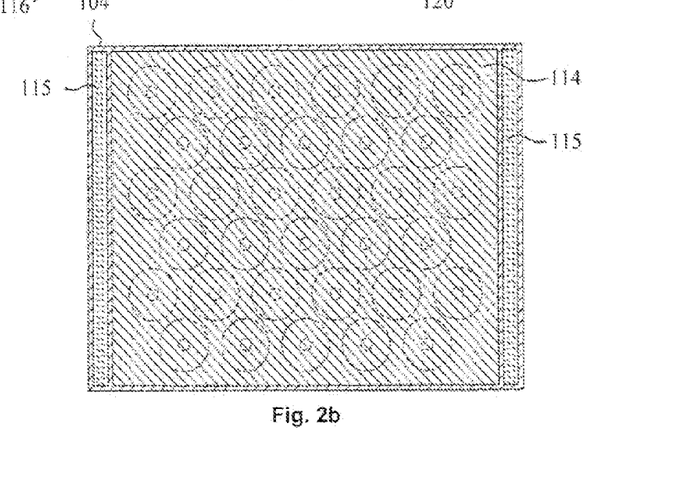
FIG. 2b is schematic representation of a plan view of an array of LED devices.

FIGS. 2a and 2b show an LED chip including an array of LED devices formed on a substrate. The same reference numerals as used in FIG. 1 are used for similar features in FIGS. 2a and 2b.

Referring to FIG. 2a, a substrate 102 has a plurality of LED devices 100 formed thereon. In the exemplary array of FIGS. 2a and 2b, the LED devices are μLED devices. The plurality of LED devices 100 include a semiconductor material 104 formed into a plurality of mesas 106. The plurality of mesas 106 are positioned in an array, as shown in FIG. 2b. The electrical contact 114 is deposited over the entire array of LED devices 100. The electrical contact 114 is electrically isolated from the semiconductor material 104 by an electrical insulating layer 110, except at the tops of the mesas 106 where an aperture 112 allows the electrical contact 114 to make contact with the light emitting layer 108 (shown in greater detail in FIG. 1). The electrical contact 114 is termed the top contact. A further electrical contact 115 is termed the bottom electrical contact and is in electrical communication with the semiconductor material 104.

It is noted that the mesas are configured to provide a quasi-collimated light output for the LED devices 100 and may have any shape for that purpose. The mesas need not be circular, as is shown in the exemplary LED devices of FIGS. 2a and 2b.

The optical component 120 is located at the light emitting surface 116 of the LED device array. The surface is opposite to that of the light generating layer. In the exemplary LED device array of FIGS. 2a and 2b, the optical component 120 is continuous across the surface 116 of the array and is large enough to cover all of the LED devices 100 in the array. In other exemplary arrays, the optical component may be dimensioned to cover the light emitting surface of one or more LED devices 100 in the array.

FIGS. 3a-f show the steps of a method of fabricating an LED device. The same reference numerals as used in FIG. 1 are used for similar features in FIG. 3.

Figure 3A:
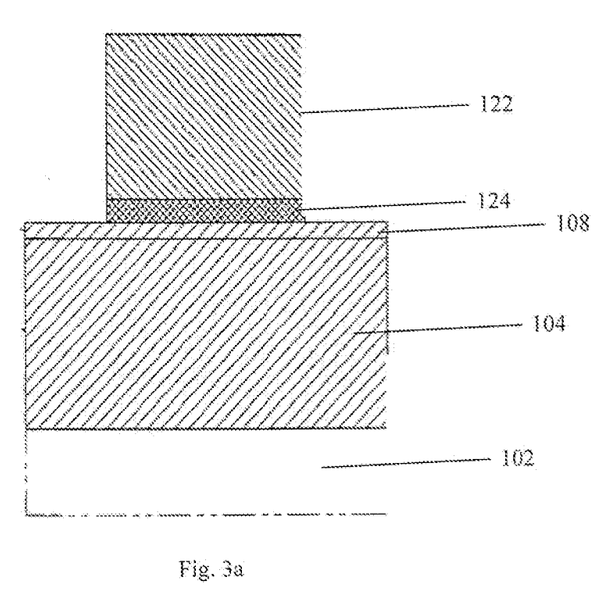
FIG. 3 is a flow diagram showing a method of fabricating an LED device.

FIG. 3a: perform lithography on a dual layer resist 122, 124. A bottom layer 124 of a multi-layer etch mask is pre-exposed, and can be further developed later on in the process. The bottom layer 124 can also be another sacrificial layer that can be etched later on to create an undercut profile for selective lift-off of part of the insulating layer.

Figure 3B:
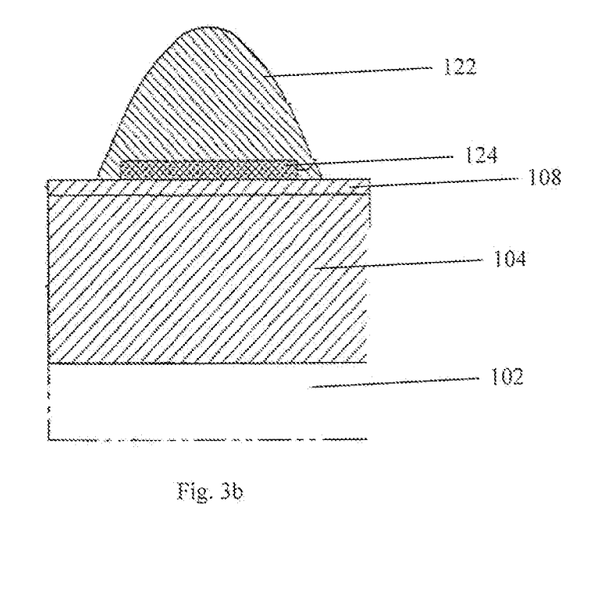

FIG. 3b: the multi-layer etch mask is reflowed to the desired shape at a specific time and temperature, to create in the next step, a near-parabolic profile in the semiconductor material 104.

Figure 3C:
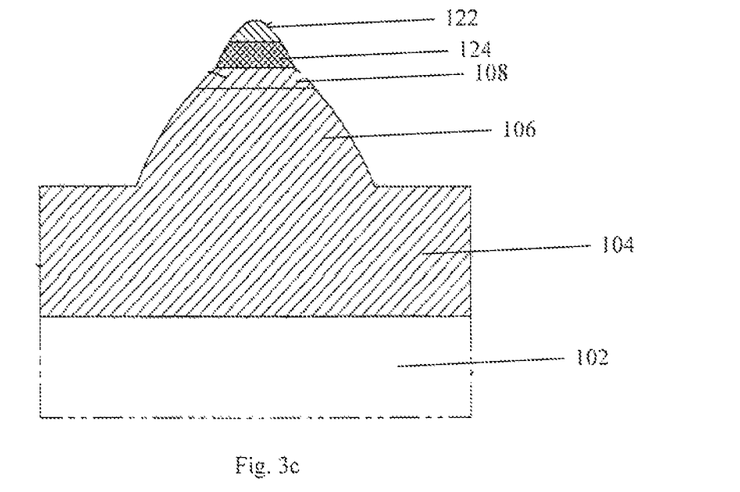

FIG. 3c: dry etching, e.g. by ICP or RIE to transfer the desired shape into the semiconductor material 104.

Figure 3D:
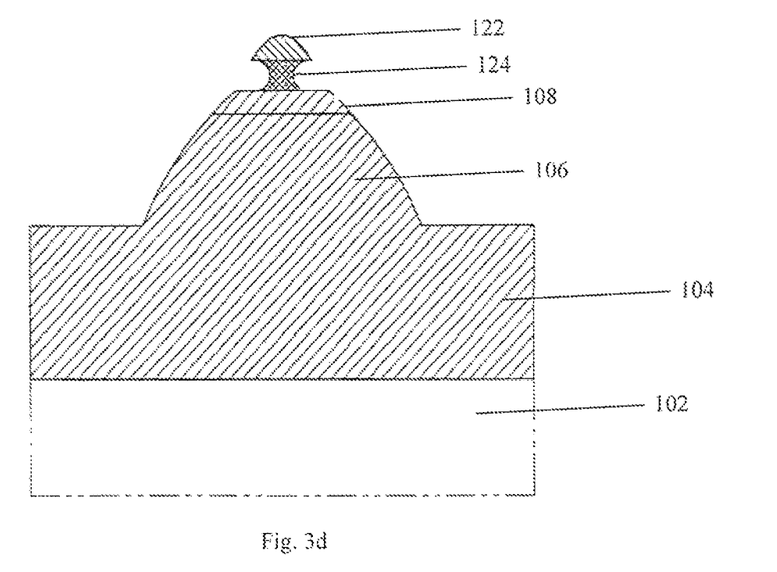

FIG. 3d (optional): an oxygen plasma step to reduce the size of the multi-layer mound. This will allow for a top electrical contact 114 that is smaller than the top diameter of the mesa 106.

FIG. 3d: further develop the bottom layer 124 to create an overhang profile in the two-layer resist. This is to facilitate the lift-off of part of the insulating coating 110, to make place for the top electrical contact 114.

Figure 3E:
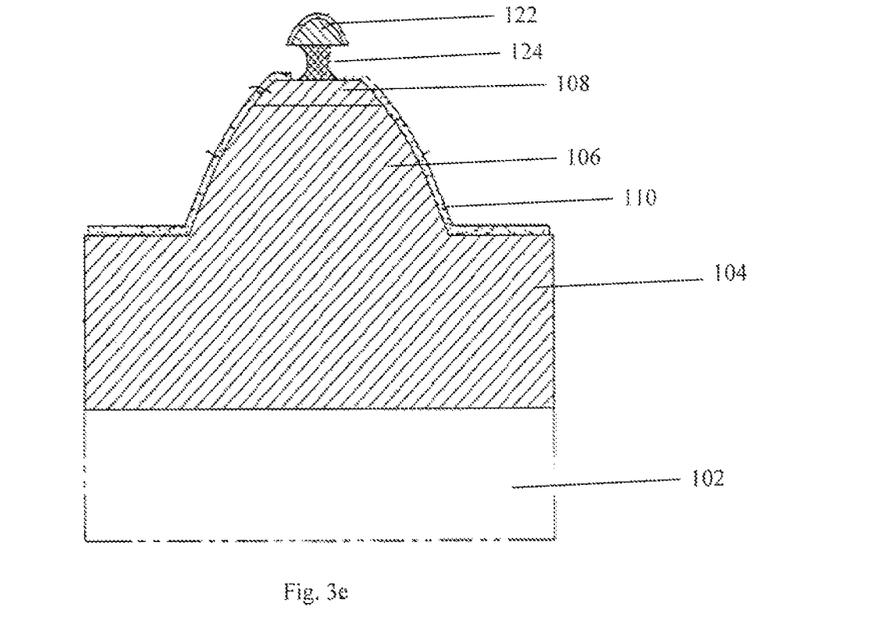

FIG. 3e: an insulating coating 110 is deposited over the mesas 106.

Figure 3F:
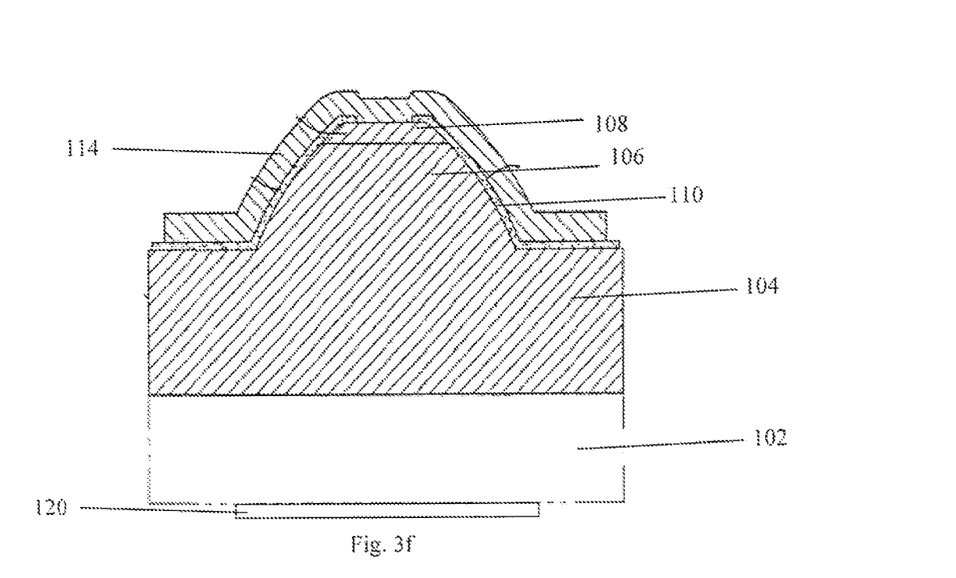

FIG. 3f: the remaining resist and the unwanted insulator coating 110 are removed. This is facilitated by the resist undercut.

FIG. 3f: post-processing of the LED device material. This step includes the polishing of the light emitting surface LED material such that the material is flat. The polishing of the LED material to form a flat surface is advantageous so that the light generated in the semiconductor material of the light generating layer is incident on an optical layer that is substantially planar. The LED post-processing step may also include the thinning of the LED material to dimensions between 100 and 250 um. At the conclusion of the LED post-processing step the LED material may or may not be cut (diced) into smaller pieces.

FIG. 3f: deposit an optical component 120 on the light emitting surface 116 of the LED device 100. The optical component may be a coating, which can be deposited by any suitable method such as evaporation, sputtering, Chemical Vapor Deposition (CVD), metalorganic CVD, plasma enhanced CVD, physical vapour deposition (PVD), vapour phase epitaxy, atomic layer epitaxy, electron beam PVD, ion beam sputtering, spin coating, magnetron sputtering, reactive sputtering, UV curing, ion assisted deposition, sol-gel coating, molecular beam epitaxy, electroplating or other methods.

The coating may be patterned. This may be accomplished using appropriate masking or etching technologies during fabrication.

Disclosed herein is a quasi-collimated μLED device, which includes an LED and an optical coating, which is applied to the light emitting region of the LED. The coating may be a single layer. The coating may encompass multiple layers. The coating may act as an optical filter. The filter may be an absorption filter, a dichroic filter, a polarizing filter or a metallo-dielectric filter. The coating may be a metal reflective layer or act as a blocking layer. The coating may act as a photosensitive detection material. The coating may be electro-active. The coating may act as a lens. The coating may act as a resist to enable the formation of shaped structures on the substrate. The coating may act as a phosphor to produce light at a different wavelength to that emitted by the LED device. The coating may produce a diffraction pattern. The coating may act as a scintillator for converting photons. The filter may be an absorption filter, a transmission filter or a dichroic filter. The coating may be configured to modify the polarisation of the light and may be configured to act as a polarisation filter, a polarisation changer amongst other polarisation effects. The coating may be patterned.

The skilled person will be able to envisage other implementations of the invention without departing from the scope of the appended claims.

The invention claimed is:

1. An integrated μLED device comprising:
a semiconductor material comprising a light emitting layer, wherein at least part of the semiconductor material forms a truncated parabolic mesa configured internally to reflect light generated by the light emitting layer to output quasi-collimated light from a light emitting surface opposed to a top of the mesa of the μLED device; and
an optical component positioned at the light emitting surface and configured to receive the quasi-collimated light exiting the light emitting surface and to alter one or more optical properties of at least some beams of the quasi-collimated light.

2. The μLED device according to claim 1, wherein the optical component comprises a coating deposited on the light emitting surface of the μLED device.

3. The μLED device according to claim 2, wherein the coating comprises one or more oxide layers.

4. The μLED device according to claim 3, wherein the coating comprises alternating oxide layers having different refractive indices.

5. The μLED device according to claim 1, wherein the optical component comprises an optical filter.

6. The μLED device according to claim 5, wherein the optical filter comprises at least one of an absorption filter, a dichroic filter, a polarizing filter and a metallo-dielectric filter.

7. The μLED device according to claim 1, wherein at least a portion of the optical component acts as a lens.

8. The μLED device according to claim 1, wherein the optical component comprises a blocking element configured to block light emitted by the μLED device at angles above a predetermined threshold angle.

9. The μLED device according to claim 8, wherein the blocking element includes a metal reflective layer configured to internally reflect light attempting to escape the μLED device.

10. The μLED device according to claim 1, wherein the optical component comprises at least one of: an anti-scratch layer; a hydrophobic layer; an anti-reflective layer; and a thermally conductive layer.

11. The μLED device according to claim 1, wherein the optical component comprises at least one of: phosphors, nano-materials and quantum dots, configured to emit a wavelength of light different from the wavelength of light emitted by the μLED device.

12. The μLED device according to claim 1, wherein the optical component is patterned to produce a patterned light beam.

13. The μLED device according to claim 1, wherein the optical component is configured to produce a light beam having a diffraction pattern.

14. An μLED chip comprising an array of μLED devices of claim 1.

15. A method of fabricating an integrated μLED device comprising:
depositing a layer of semiconductor material, the semiconductor material comprising a light generating layer,
forming at least a part of the semiconductor material into a truncated parabolic mesa configured internally to reflect light generated by the light generating layer to output quasi-collimated light from a light emitting surface opposed to a top of the mesa of the μLED device; and
positioning an optical component at the light emitting surface, the optical component receiving, in use, the quasi-collimated light exiting the light emitting surface and altering one or more optical properties of at least some beams of the quasi-collimated light.

16. The method according to claim 15, wherein the optical component is a coating deposited on the light emitting surface of the μLED device.

* * * * *